United States Patent

Gottschalk-Schoenig

[11] Patent Number: 5,912,977
[45] Date of Patent: Jun. 15, 1999

[54] DISTORTION SUPPRESSION IN HEARING AIDS WITH AGC

[75] Inventor: Georg Gottschalk-Schoenig, Erlangen, Germany

[73] Assignee: Siemens Audiologische Technik GmbH, Erlangen, Germany

[21] Appl. No.: 08/814,242

[22] Filed: Mar. 11, 1997

[30] Foreign Application Priority Data

Mar. 20, 1996 [DE] Germany .......................... 196 11 026

[51] Int. Cl.$^6$ .................................................. H04R 25/00
[52] U.S. Cl. ........................... 381/321; 381/312; 381/108
[58] Field of Search .................................. 381/317, 318, 381/320, 321, 312, 107, 108; 330/129, 281, 141

[56] References Cited

U.S. PATENT DOCUMENTS 5,408,197  4/1995  Miyake ..................................... 330/129
5,566,363  10/1996  Senda ....................................... 330/129

FOREIGN PATENT DOCUMENTS 23 53 696  5/1975  Germany .
19 27 848  6/1975  Germany .

Primary Examiner—Huyen Le
Attorney, Agent, or Firm—Hill & Simpson

[57] ABSTRACT

In a method and an amplifier circuit for harmonic distortion suppression in hearing aids with signal-dependent gain control (AGC), a number of decay times of different length are prescribed for the gain control, and a switch is made between the decay times, and the selection of the respective decay time ensues dependent on a status change of the signal to be processed.

25 Claims, 1 Drawing Sheet

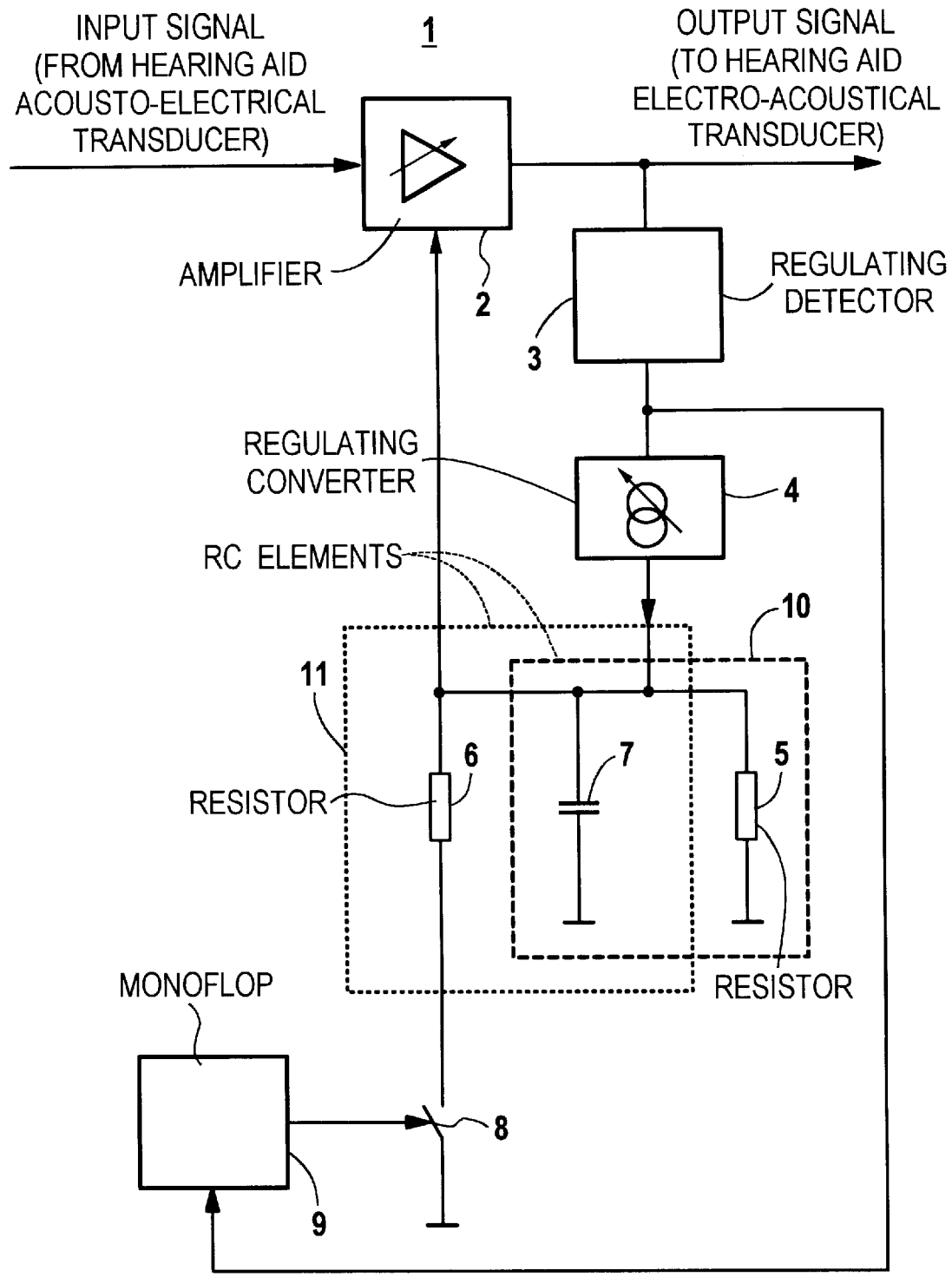

DISTORTION SUPPRESSION IN HEARING AIDS WITH AGC

BACKGROUND OF THE INVENTION

1. Field of the Invention

The present invention is directed to a method as well as an amplifier circuit for distortion suppression of regulated signal amplification in a hearing aid.

2. Description of the Prior Art

Currently, hearing aids usually have an amplifier with gain control (AGC) that is dependent on the signal level. This gain control makes it possible to amplify the signals in such a way that they are clearly audible to the user while still maintaining the sound sensation pleasant for the user given high input signals.

Given an amplifier with gain control that is dependent on signal level, harmonic distortion that the user considers disturbing occurs due to the control function. This can be clearly seen given a constant sine input signal, whereby a constant re-adjustment is required even in the steady state. The re-adjustment intensity is dependent on the decay time of the amplifier circuit. The harmonic distortion is directly dependent on the re-adjustment intensity, and thus is indirectly dependent on the decay time. Longer decay times are required in order to achieve low harmonic distortion. Given the minimal decay times that are currently standard and desirable in hearing aids, the harmonic distortion can only be kept within a tolerable degree with considerable technical outlay. As a result, standards for hearing aids are partly difficult to meet or cannot be met at all in certain cases.

German OS 23 53 696 discloses a hearing aid with an automatic gain control for which a number of different response/decay times are prescribed between which changes optionally can be made. The setting ensues via adjustment means that are manually actuated.

Further, German OS 19 27 848 discloses a hearing aid that has a multi-stage transistor amplifier with an input to which a microphone is connected via two signal lines, and a stage in the proximity of the amplifier output containing a gain control circuit that acts automatically from its output onto its input, and the input of the stage contains a voltage divider in the first signal line. This voltage divider is composed of a fixed resistor and a resistor branch composed of two diodes connected with opposite polarity in terms of alternating current that is variable dependent on the output signal. As a result, the delays appearing in corresponding circuits can be avoided since the d.c. circuit of the amplifier itself remains uninfluenced.

SUMMARY OF THE INVENTION

An object of the present invention is to provide a method and an amplifier circuit available that enable a reduction of the harmonic distortion of the automatic gain control in a hearing aid.

In accordance with the invention, the above object is achieved in a method and an amplifier circuit wherein a number of decay times of the gain control that differ in length are prescribed for the gain control, and a selection of the respective decay time ensues dependent on a status change of the signal to be processed. An amplification that is undertaken is maintained with weak readjustments as a result of the long decay time. Low harmonic distortion consequently occurs because of the long decay time. Insofar as the status of the signal changes, for example it becomes smaller and the amplification must therefore be increased, a switch is made to the shorter decay time. The harmonic distortion of the gain control can be substantially minimized as a result. Moreover, the invention enables a realization of shorter decay times without an increase in the distortion factor of the gain control. The distortion suppression that can be achieved roughly corresponds to the relationship of long decay time to short decay time.

The activation of the desired decay time can ensue by indirect or direct acquisition of the change in the signal level.

According to an embodiment of the invention that is simple to realize, such an acquisition can be undertaken by evaluating regulating pulses of the gain control that are caused by the output signal.

Preferably, the regulating pulses for this purpose tapped are taken at the output of the amplifier circuit. As needed, however, it is possible to undertake a signal evaluation at a different or at a number of tap points of the signal path.

According to a further embodiment of the invention, the response duration of the switching event between longer and shorter decay times is longer than the regulating pulses generated by the signal in order to avoid reactive switching. The switching event as such is thereby not degraded due to regulating pulses as a result of the signal processing.

The response duration of the switching event is preferably defined by the lowest signal frequency and/or highest cycle duration. For example, the time constant of the switch means in a single-wave rectifier must be longer than the oscillation duration of the lowest frequency. Additional, irregular, stronger regulating pulses caused by activation of the switching event can thus be avoided. Such regulating pulses can lead to output signal distortions.

In another embodiment of the inventive method, two different decay times $t_1$ and $t_2$ are prescribed. For example, the decay times can differ by a factor in the range of about 10.

Another embodiment of the invention is directed to the possibility or making at least one of the prescribed decay times variable for adaptation to different auditory situations. This creates the possibility of matching the decay characteristic for harmonic distortion correction to specifically occurring auditory situations (ambient car noise, party noise, etc.). This matching can be expediently undertaken at the hearing aid by the user when the hearing aid is equipped with a corresponding setting element.

The invention is also advantageous by allowing the setting of the decay times of the gain control to be accomplished by digital signal processing in a simple technical realization.

An amplifier circuit for harmonic distortion suppression has means for prescribing at least one decay time for the gain control (in addition to a settable or preset decay time), whereby the decay times are different, and means for switching between the different decay times, whereby the switching ensues dependent on a status change of the signal, particularly a level change of the signal.

The acquisition of the level change can ensue in a variety of ways. A technically simple solution uses a regulating detector therefor that is connected to a switch for switching between the decay times.

The acquisition of the status change of the signal can ensue at different locations. Expediently, the acquisition of the status change of the signal is undertaken at the output side of the gain control amplifier, however, this status change can also be identified at other locations.

Expediently, the time constant $t_M$ for switching between the individual decay times is longer than the time intervals of the regulating pulses, i.e. than the clocking thereof, so that unintended switching between the individual decay times is avoided.

For example, decay times of different length can be achieved in a simple way by a combination of dynamic and static elements. To this end, a capacitor can be provided as a dynamic element and an ohmic load can be provided as a static element.

In another embodiment of the inventive amplifier circuit at least one of the different decay times is variable. If desired, the user can also adapt the decay behavior of the gain control to different ambient auditory situations by actuating a setting element.

The invention is also particularly suited for use in hearing aids with digital signal processing, whereby different decay times are calculated by suitable signal processing algorithms and applied.

Moreover, it is possible to define different decay times for different auditory situations to be fetchable in a memory means.

DESCRIPTION OF THE DRAWINGS

The FIGURE shows an embodiment of an arrangement of the amplifier circuit for harmonic distortion suppression for use in a hearing aid constructed and operating in accordance with the invention.

DESCRIPTION OF THE PREFERRED EMBODIMENTS

An amplifier circuit has an amplifier 2 for amplification of an input signal from a hearing aid acousto-electrical transducer (such as a microphone) dependent on its input level (AGC). The output signals of the amplifier 2, to the hearing aid's electro-acoustical transducer (such as an earphone), are tapped by a regulating detector 3 (for example, a comparator). A level-dependent acquisition of the output signals ensues with the regulating detector 3.

The voltage across a capacitor 7 controls the gain factor of the amplifier 2.

The regulating detector 3 is in communication with a regulating converter 4 that determines the rise rate of the voltage across the capacitor 7, and thus determines the response time of the gain control (also referred to as "attack" time).

The determination of the decay time (also called "release" time) ensues with a resistor 5 connected to the regulating converter 4 that discharges the capacitor 7 at a predetermined time $t_2$ produced by an RC element 10. Accordingly, the RC element 10 defines the time at which the gain is again increased.

In addition to the RC element 10, the amplifier circuit 1 has a further RC element 11 formed by a parallel circuit with a further resistor 6, whereby the RC element 11 defines a release time $t'_1$.

The release time $t'_1$ of the RC element 11 is much shorter than the release time $t_2$ of the parallel RC element 10. For example, the release time $t'_1$ amounts to 50 ms and the release time $t_2$ amounts to 500 ms.

The resistor 6 lies at a switch 8 that is held open by a monoflop 9 having a time constant $t_M$. When the regulating detector 3 responds due to the level of the output signals, the gain of the amplifier 2 is decreased by the feedback via the RC element 10. The slow decay time $t_2$ ensures that regulating pulses that are always weak and defined by the output signal occur as long as the input signal does not decrease. The monoflop 9 is also simultaneously set with every regulating pulse.

So that no additional regulating pulses are initiated by the monoflop 9 as long as the input signal does not decrease, the time constant $t_M$ of the monoflop should be greater than the time intervals of the regulating pulses that are caused by the signal. The defining factor is the lowest signal frequency and/or the longest cycle duration. For example, the time constant $t_M$ of the monoflop 9 must be longer than the oscillation duration of the lowest frequency given a half-wave rectifier and must be greater than half the cycle duration given a full-wave rectifier.

When the input signal at the amplifier 2 decreases, the amplifier circuit 1 automatically switches to a shorter decay time. The regulating detector 3 does not emit any regulating pulses when the input signal decreases. As a result, the switch 8 is closed after the expiration of the time constant $t_M$ of the monoflop 9, and the gain is thereby boosted with a shorter decay time $t_1$ as a result. As soon as the input signal rises again, i.e. regulating pulses are again emitted by the regulating detector 3, the monoflop 9 is set again, causing the switch 8 to be opened and the amplifier circuit 1 drops back to the decay time $t_2$.

The overall decay time $t_1$ given the amplifier circuit 1 shown in the FIGURE is composed, according to the following equation, of the time constant $t_M$ of the monoflop 9 and the parallel circuit of the ohmic resistors 5 and 6 with the respective release times $t'_1$ and $t_2$:

$$t_1 = t_M + \frac{t'_1 \times t_2}{t'_1 + t_2},$$

with $t_2 >> t'_1 : t_1 \approx t_M + t'_1$.

As a result of the inventive circuit, a harmonic distortion suppression occurs in the ratio of the decay times $t_2/t'_1$.

Only minimal decay times of about 40–50 ms have previously been possible in practical application in the audiological field since the harmonic distortion becomes too great otherwise. Considerably shorter decay times with the same or even lower harmonic distortion can be realized with the inventive circuit and method. The shortest decay time that can be achieved is, with $t'_1 = 0$, $$t_M, \text{decay time} = \frac{t_M \times t_2}{t_M + t_2} \approx t_M$$

Since only signal frequencies with more than 100 Hz occur in hearing aids, the minimum decay time that can be realized amounts to about 10 ms for a half-wave rectifier and 5 ms for a full-wave rectifier.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for suppressing harmonic distortion arising in an output signal in a hearing aid due to amplification of an input signal in an AGC amplifier, said method comprising the steps of:

amplifying an audio input signal, subject to status changes, in an AGC amplifier, said status changes of said input signal respectively causing different harmonic distortions of said input signal when amplified in said amplifier;

prescribing a plurality of decay times, respectively differing in length, for gain control for said amplifier;

switching said amplifier for controlling the gain thereof between successive decay times of said amplifier; and selecting one of said plurality of decay times whenever one of said status changes occurs, dependent on said one of said status changes to reduce said harmonic distortion.

2. A method as claimed in claim 1 wherein the step of selecting one of said decay times comprises selecting a longer one of said decay times when, dependent on said status change, no boost of the amplification of said amplifier is needed and selecting to a shorter one of said decay times, dependent on said status change, if a boost of said amplification is needed.

3. A method as claimed in claim 1 comprising the additional step of acquiring said status change of said input signal at at least one tap location along a signal path of said input signal.

4. A method as claimed in claim 1 comprising the additional steps of generating a plurality of regulating pulses varying in number for controlling said amplifier dependent on said status change, and selecting said one of said decay times dependent on the number of said regulating pulses.

5. A method as claimed in claim 1 comprising the step of identifying said status change of said input signal by monitoring a signal level associated with said input signal.

6. A method as claimed in claim 5 comprising the step of identifying a status change of said input signal by tapping an output signal of said amplifier.

7. A method as claimed in claim 5 comprising the step of identifying a status change by tapping a signal at an input of said amplifier.

8. A method as claimed in claim 1 wherein switching of said amplifier for controlling the gain thereof has a response duration associated therewith, wherein said amplifier is regulated by regulating pulses which are altered by said status change of said input signal, and wherein each regulating pulse has a time interval associated therewith which is less than said response duration.

9. A method as claimed in claim 8 wherein said input signal has a lowest signal frequency, and wherein said response duration is determined by said lowest signal frequency.

10. A method as claimed in claim 8 wherein said input signal has a highest cycle duration associated therewith, and wherein said response duration is determined by said highest cycle duration.

11. A method as claimed in claim 1 wherein the step of prescribing a plurality of decay times comprises prescribing two decay times.

12. A method as claimed in claim 1 wherein the step of prescribing a plurality of decay times includes prescribing at least one decay time which is variable in length for adaptation to different conditions of said input signal.

13. A method as claimed in claim 1 wherein the step of prescribing said plurality of different decay times comprises prescribing said plurality of different decay times by digital signal processing.

14. An amplifier circuit for harmonic distortion suppression in a hearing aid, said amplifier circuit comprising:

an AGC amplifier for amplifying an audio input signal, subject to status changes, and having a first decay time associated with gain control of said amplifier said status changes of said input signal respectively causing different harmonic distortions of said input signal when amplified in said amplifier;

means for prescribing at least one second decay time for gain control of said amplifier, different from said first decay time; and means for switching between said first and second decay times wherein one of said status changes occurs, dependent on said one of said status changes to reduce said harmonic distortion.

15. An amplifier circuit as claimed in claim 14 wherein said means for switching comprises means for switching between said first and second decay times dependent on a level change of said input signal as said status change.

16. An amplifier circuit as claimed in claim 14 comprising means for acquiring said status change including a regulating detector connected to a switch for switching between said first and second decay times.

17. An amplifier circuit as claimed in claim 14 comprising means for identifying said status change of said input signal of said amplifier by tapping an output side of said amplifier.

18. An amplifier circuit as claimed in claim 14 wherein one of said first and second decay times comprises a longer decay time than the other, wherein said regulating detector emits regulating pulses during a predetermined time for controlling the gain of said amplifier, and wherein said means for switching comprises means for switching to said longer decay time if said predetermined time is downwardly transgressed.

19. An amplifier circuit as claimed in claim 18 wherein said means for switching comprises a switch controlled by a monoflop, said monoflop being set with each regulating pulse of said regulating detector and holding said switch open until said predetermined time elapses.

20. An amplifier circuit as claimed in claim 19 wherein each regulating pulse has a time interval associated therewith when an unchanging input signal is present at said input of said amplifier, and wherein said monoflop has a time constant which is longer than said time interval.

21. An amplifier circuit as claimed in claim 14 wherein said means for prescribing said at least one second decay time comprises a combination of a plurality of dynamic and static elements.

22. An amplifier circuit as claimed in claim 21 wherein one of said dynamic elements comprises a capacitor and one of said static elements comprises an ohmic load.

23. An amplifier circuit as claimed in claim 14 wherein said means for prescribing at least one second decay time comprises means for prescribing at least one variable second decay time.

24. An amplifier circuit as claimed in claim 14 wherein said means for prescribing said at least one second decay time comprises means for prescribing said at least one second decay time by digital signal processing.

25. An amplifier circuit as claimed in claim 24 wherein said means for prescribing at least one second decay time comprises memory means for storing a plurality of different decay times respectively associated with different auditory situations, and means for fetching one of said stored decay times from said memory means.

* * * * *